(12) United States Patent
Katsuno et al.

(10) Patent No.: US 9,373,753 B2
(45) Date of Patent: Jun. 21, 2016

(54) METHOD FOR MANUFACTURING SEMICONDUCTOR LIGHT EMITTING DEVICE

(71) Applicant: Kabushiki Kaisha Toshiba, Minato-ku (JP)

(72) Inventors: Hiroshi Katsuno, Tokyo (JP); Yasuo Ohba, Kanagawa-ken (JP); Shinji Yamada, Tokyo (JP); Mitsuhiro Kushibe, Tokyo (JP); Kei Kaneko, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/547,226

(22) Filed: Nov. 19, 2014

(65) Prior Publication Data
US 2015/0072459 A1   Mar. 12, 2015

Related U.S. Application Data

(62) Division of application No. 13/204,021, filed on Aug. 5, 2011, now Pat. No. 8,921,886.

(30) Foreign Application Priority Data

Feb. 28, 2011 (JP) ................................. 2011-042596

(51) Int. Cl.
*H01L 21/00* (2006.01)
*H01L 33/40* (2010.01)
*H01L 23/00* (2006.01)

(52) U.S. Cl.
CPC .............. *H01L 33/405* (2013.01); *H01L 24/32* (2013.01); *H01L 33/40* (2013.01);
(Continued)

(58) Field of Classification Search
CPC ..................... H01L 33/405; H01L 2933/0016; H01L 33/40; H01L 2224/48091; H01L 2924/00014; H01L 33/20; H01L 24/32; H01L 2224/73265; H01L 2924/12042
USPC ........................................... 257/762, E21.324
See application file for complete search history.

(56) References Cited

U.S. PATENT DOCUMENTS 6,326,294 B1   12/2001  Jang et al.
6,723,192 B2 *  4/2004  Nagano ................. H05B 33/02
                                            156/246
(Continued)

FOREIGN PATENT DOCUMENTS

JP   11-220171      8/1999
JP   2003-168823    6/2003
(Continued)

OTHER PUBLICATIONS

Office Action issued Sep. 27, 2011 in Japan Application No. 2011-042596 (w/English translation).

*Primary Examiner* — Yosef Gebreyesus
(74) *Attorney, Agent, or Firm* — Oblon, McClelland, Maier & Neustadt, L.L.P.

(57) ABSTRACT

According to one embodiment, a semiconductor light emitting device includes a stacked structure body and an electrode. The stacked structure body has a first conductivity type first semiconductor layer including a nitride-based semiconductor, a second conductivity type second semiconductor layer including a nitride-based semiconductor, and a light emitting layer provided between the first and second semiconductor layers. The electrode has first, second and third metal layers. The first metal layer is provided on the second semiconductor layer and includes silver or silver alloy. The second metal layer is provided on the first metal layer and includes at least one element of platinum, palladium, rhodium, iridium, ruthenium, osmium. The third metal layer is provided on the second metal layer. A thickness of the third metal layer along a direction from the first toward the second semiconductor layer is equal to or greater than a thickness of the second metal layer.

17 Claims, 8 Drawing Sheets

(52) U.S. Cl.
CPC ........... *H01L 2224/48091* (2013.01); *H01L 2224/49107* (2013.01); *H01L 2224/73265* (2013.01); *H01L 2924/12041* (2013.01); *H01L 2924/12042* (2013.01); *H01L 2933/0016* (2013.01)

(56) References Cited

U.S. PATENT DOCUMENTS

| | | | |
|---|---|---|---|
| 7,615,794 B2 | 11/2009 | Katsuno et al. | |
| 2003/0006409 A1 | 1/2003 | Ohba | |
| 2005/0040423 A1 | 2/2005 | Okazaki et al. | |
| 2005/0051786 A1 | 3/2005 | Okazaki et al. | |
| 2005/0247949 A1 | 11/2005 | Senda et al. | |
| 2006/0183625 A1* | 8/2006 | Miyahara | C04B 35/053 501/98.4 |
| 2008/0210957 A1 | 9/2008 | Watanabe et al. | |
| 2009/0050916 A1 | 2/2009 | Katsuno et al. | |
| 2010/0051978 A1* | 3/2010 | Katsuno | H01L 33/32 257/94 |
| 2010/0051994 A1 | 3/2010 | Katsuno et al. | |
| 2010/0051995 A1 | 3/2010 | Katsuno et al. | |
| 2010/0059734 A1 | 3/2010 | Kaneko et al. | |
| 2010/0186999 A1* | 7/2010 | Kuramoto | H01L 33/62 174/257 |
| 2011/0049541 A1 | 3/2011 | Katsuno et al. | |
| 2012/0168803 A1 | 7/2012 | Lee et al. | |
| 2012/0235204 A1 | 9/2012 | Hodota et al. | |

FOREIGN PATENT DOCUMENTS

| | | |
|---|---|---|
| JP | 2005-117040 | 4/2005 |
| JP | 2007-42952 | 2/2007 |
| JP | 2007-110056 | 4/2007 |
| JP | 2008-103674 | 5/2008 |
| JP | 2009-49266 | 3/2009 |
| JP | 2010-171142 | 8/2010 |

\* cited by examiner

METHOD FOR MANUFACTURING SEMICONDUCTOR LIGHT EMITTING DEVICE

CROSS-REFERENCE TO RELATED APPLICATIONS

This application is a division of and claims the benefit of priority under 35 U.S.C. §120 from U.S. Ser. No. 13/204,021 filed Aug. 5, 2011, and claims the benefit of priority under 35 U.S.C. §119 from Japanese Patent Application No. 2011-042596 filed Feb. 28, 2011; the entire contents of each of which are incorporated herein by reference.

FIELD

Embodiments described herein relate generally to a semiconductor light emitting device, a semiconductor light emitting apparatus, and a method for manufacturing the semiconductor light emitting device.

BACKGROUND

It is desired to use a material having a high reflectivity as an electrode in order to improve light extraction efficiency of a semiconductor light emitting device such as an LED (Light Emitting Diode). Silver or silver alloy exhibits high reflection characteristics also to short-wavelength emission light of 400 nm or less and is excellent in electrical characteristics, such as ohmic characteristics and contact resistance. On the other hand, in silver or silver alloy, migration and chemical reaction are prone to occur and furthermore, adhesiveness is low. In a semiconductor light emitting device using such silver or silver alloy as an electrode, there is room for improvement to achieve a still higher reflectivity, higher electrical characteristics, higher stability, and higher adhesiveness.

DETAILED DESCRIPTION

Figure 1A:
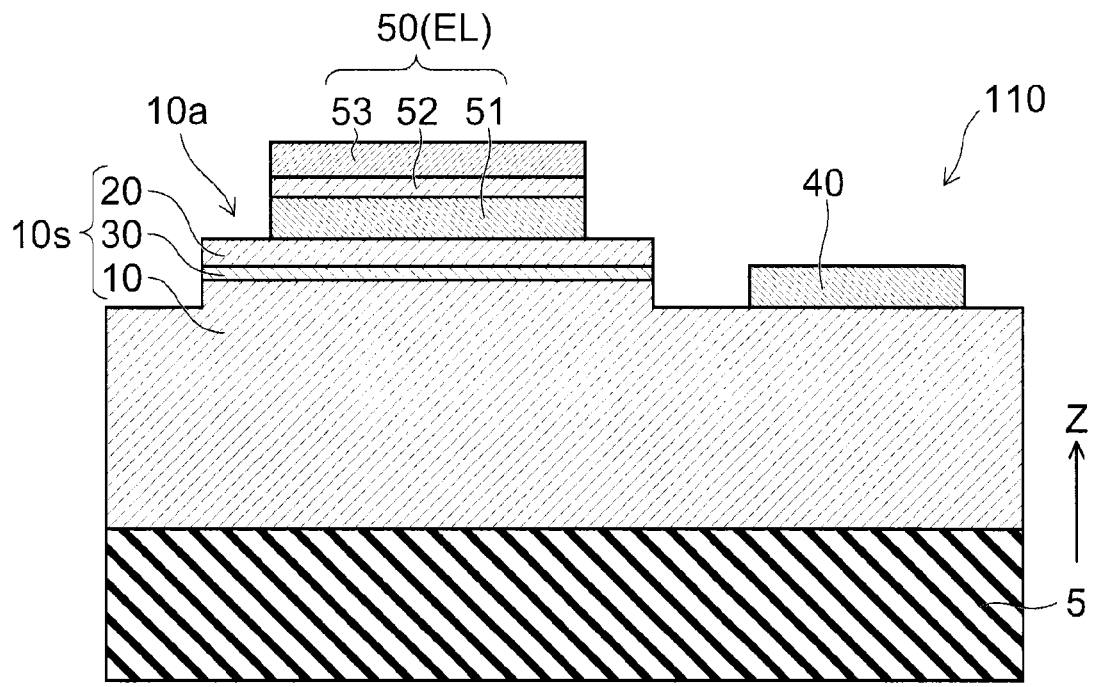
FIGS. 1A and 1B are schematic views showing a semiconductor light emitting device.

In general, according to one embodiment, a semiconductor light emitting device includes a stacked structure body and an electrode.

The stacked structure body has a first conductivity type first semiconductor layer including a nitride-based semiconductor, a second conductivity type second semiconductor layer including a nitride-based semiconductor, and a light emitting layer provided between the first semiconductor layer and the second semiconductor layer.

The electrode has a first metal layer, a second metal layer, and a third metal layer. The first metal layer is provided on the second semiconductor layer and includes silver or silver alloy. The second metal layer is provided on the first metal layer and includes at least one element of platinum, palladium, rhodium, iridium, ruthenium, osmium. The third metal layer is provided on the second metal layer. A thickness of the third metal layer along a direction from the first semiconductor layer toward the second semiconductor layer is equal to or greater than a thickness of the second metal layer along the direction.

In general, according to one other embodiment, a semiconductor light emitting apparatus includes a semiconductor light emitting device and a fluorescent material.

The semiconductor light emitting device includes a stacked structure body and an electrode.

The stacked structure body has a first conductivity type first semiconductor layer including a nitride-based semiconductor, a second conductivity type second semiconductor layer including a nitride-based semiconductor, and a light emitting layer provided between the first semiconductor layer and the second semiconductor layer.

The electrode has a first metal layer, a second metal layer, and a third metal layer. The first metal layer is provided on the second semiconductor layer and includes silver or silver alloy. The second metal layer is provided on the first metal layer and includes at least one element of platinum, palladium, rhodium, iridium, ruthenium, osmium. The third metal layer is provided on the second metal layer. A thickness of the third metal layer along a direction from the first semiconductor layer toward the second semiconductor layer is equal to or greater than a thickness of the second metal layer along the direction.

The fluorescent material absorbs light emitted from the semiconductor light emitting device and emits light having a wavelength different from a wavelength of the light.

In general, according to one other embodiment, a method is disclosed for manufacturing a semiconductor light emitting device. The semiconductor light emitting device has a stacked structure body and an electrode. The stacked structure body has a first conductivity type first semiconductor layer including a nitride-based semiconductor, a second conductivity type second semiconductor layer including a nitride-based semiconductor, and a light emitting layer provided between the first semiconductor layer and the second semiconductor layer. The electrode is provided on a side opposite to the light emitting layer with respect to the second semiconductor layer.

The method can include forming a first metal layer including silver or silver alloy on the opposite side surface of the light emitting layer with respect to the second semiconductor layer. The method can include forming a second metal layer including at least one element of platinum, palladium, rhodium, iridium, ruthenium, osmium on the first metal layer. The method can include forming a third metal layer on the second metal layer. A thickness of the third metal layer along a direction from the first semiconductor layer toward the second semiconductor layer is equal to or greater than a thickness of the second metal layer along the direction.

In addition, the method can include performing sinter processing on the second semiconductor layer, the first metal layer, the second metal layer, and the third metal layer in an atmosphere including oxygen.

Various embodiments will be described hereinafter with reference to the accompanying drawings.

The drawings are schematic or conceptual; and the relationships between the thicknesses and widths of portions, the ratio coefficients of sizes among portions, etc., are not necessarily the same as the actual values thereof. Further, the dimensions and the ratio coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
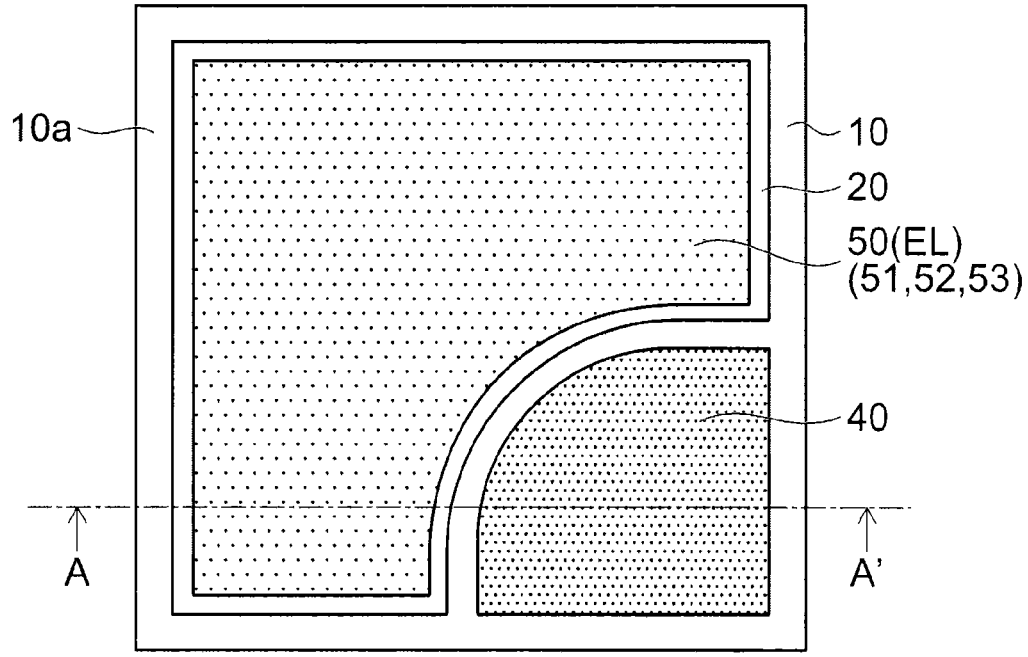

FIGS. 1A and 1B are schematic views illustrating the configuration of a semiconductor light emitting device according to a first embodiment.

That is, FIG. 1B is a schematic plane view and FIG. 1A is a cross-sectional view along an A-A' line in FIG. 1B.

As shown in FIGS. 1A and 1B, a semiconductor light emitting device 110 according to the embodiment includes a stacked structure body 10s and an electrode EL.

The stacked structure body 10s has a first conductivity type first semiconductor layer 10 including a nitride-based semiconductor, a second conductivity type second semiconductor layer 20 including a nitride-based semiconductor, and a light emitting layer 30 provided between the first semiconductor layer 10 and the second semiconductor layer 20.

The first conductivity type is, for example, an n type. The second conductivity type is, for example, a p type. However, the first conductivity type may be a p type and the second conductivity type may be an n type. Hereinafter, explanation will be given on the assumption that the first conductivity type is an n type and the second conductivity type is a p type.

The electrode EL has a first metal layer 51, a second metal layer 52, and a third metal layer 53. The first metal layer 51 is provided on a side opposite to the light emitting layer 30 with respect to the second semiconductor layer 20, and includes silver (Ag) or silver alloy.

The second metal layer 52 is provided on a side opposite to the second semiconductor layer 20 with respect to the first metal layer 51, and includes at least one element of platinum (Pt), palladium (Pd), rhodium (Rh), iridium (Ir), ruthenium (Ru), and osmium (Os). Here, in the specification of the application, "at least one element of platinum (Pt), palladium (Pd), rhodium (Rh), iridium (Ir), ruthenium (Ru), and osmium (Os)" is simply referred to as "platinum group metal element".

The third metal layer 53 is provided on a side opposite to the first metal layer 51 with respect to the second metal layer 52. Here, it is assumed that a direction from the first semiconductor layer 10 toward the second semiconductor layer 20 is referred to as a Z-axis direction. A thickness t3 of the third metal layer 53 along the Z-axis direction is equal to or greater than a thickness t2 of the second metal layer 52 along the Z-axis direction.

The first metal layer 51 and the second metal layer 52 are in contact with each other. The first metal layer 51 is in contact with the second semiconductor layer 20. The second metal layer 52 and the third metal layer 53 are in contact with each other.

The metal layer 51 is, for example, a Ag layer and its thickness is, for example, 180 nm. The second metal layer 52 is, for example, a Rh layer (rhodium layer) and its thickness is, for example, 10 nm. The third metal layer 53 is, for example, a Ni layer (nickel layer) and its thickness is, for example, 50 nm.

Then, the Ag layer, Rh layer, and Ni layer are formed, for example, successively by performing sinter processing (thermal processing) at 380° C. for one minute in an atmosphere of a mixed gas of, for example, oxygen and nitrogen in a ratio of 8:2.

The platinum group metal element content in a region including a boundary surface between the first metal layer 51 and the second semiconductor layer 20 is higher than the platinum group metal element content in a region of the first metal layer 51, which is distant from the boundary surface.

With such a configuration, it is possible to maintain excellent reflection characteristics of the first metal layer 51 including silver or silver alloy, to achieve excellent electrical characteristics such as ohmic characteristics and contact resistance, and to improve stability and adhesiveness by suppressing migration and chemical reaction of silver. Herewith, a semiconductor light emitting device that satisfies high luminance, high efficiency, and high reliability at a high level at the same time is provided.

The inventors of the invention have found that excellent characteristics are achieved in a structure in which the first metal layer 51 including silver or silver alloy is provided as the electrode EL on the second semiconductor layer 20, the second metal layer 52 including a platinum group metal element is provided thereon, and the third metal layer 53 is provided further thereon by setting the thickness of the third metal layer 53 along the Z-axis direction to be equal to or greater than the thickness of the second metal layer 52 along the Z-axis direction as a result of an experiment in which sinter processing is performed under various conditions.

The invention has been made based on the above-mentioned newly found knowledge. The results of the experiment will be described later in detail.

Hereinafter, a specific example of the configuration of the semiconductor light emitting device 110 and an example of a method for manufacturing the same are described.

As illustrated in FIGS. 1A and 1B, a first electrode 40 is provided in contact with the first semiconductor layer 10 and a second electrode 50 is provided in contact with the second semiconductor layer 20.

In the specific example, the second electrode 50 has the first metal layer 51, the second metal layer 52, and the third metal layer 53. That is, the second electrode 50 is the electrode EL.

It is possible for the second semiconductor layer 20 to have a plurality of layers, to be described later, and a layer (contact layer, to be described later) among the plurality of layers, which is arranged on the opposite side of the light emitting layer 30, is in contact with the second electrode 50 (specifically, the first metal layer 51).

In the specific example, in a region in which a part of the second semiconductor layer 20 and the light emitting layer 30 of the stacked structure body 10s on the side of a first major surface 10a is removed by, for example, etching, the first semiconductor layer 10 is exposed and the first electrode 40 is provided on the first semiconductor layer 10 in the region. Then, the second electrode 50 is provided on the second semiconductor layer 20 of the first major surface 10a.

Furthermore, in the specific example, a substrate 5 is provided on a side opposite to the light emitting layer 30 with respect to the first semiconductor layer 10. That is, for example, on the substrate 5 made of sapphire, for example, a buffer layer (not shown schematically) including a single crystal AlN is provided and the first semiconductor layer 10, the light emitting layer 30, and the second semiconductor layer 20 are stacked thereon in this order and thus the stacked structure body 10s is formed.

For example, as a layer included in the first semiconductor layer 10, the light emitting layer 30, and the second semiconductor layer 20, respectively, a nitride-based semiconductor can be used.

Specifically, as the first semiconductor layer 10, the light emitting layer 30, and the second semiconductor layer 20, for example, a gallium nitride-based compound semiconductor such as $Al_xG_{1-x-y}In_yN$ ($x\geq0$, $y\geq0$, $x+y\leq1$) is used. The method for forming the first semiconductor layer 10, the light emitting layer 30, and the second semiconductor layer 20 is arbitrary and for example, the organic metal vapor phase epitaxy method and the molecular beam epitaxial growth method, etc., can be used.

Hereinafter, an example of a method for forming the stacked structure body 10s will be described.

First, on the substrate 5, as a buffer layer, a high carbon concentration AlN first buffer layer (for example, the carbon concentration is $3\times10^{18}$ cm$^{-3}$ to $5\times10^{20}$ cm$^{-3}$ and the thickness is 3 nm to 20 nm), a high purity AlN second buffer layer (for example, the carbon concentration is $1\times10^{16}$ cm$^{-3}$ to $3\times10^{18}$ cm$^{-3}$ and the thickness is 2 μm), and a non-doped GaN third buffer layer (for example, the thickness is 3 μm) are formed sequentially in this order. The first buffer layer and the second buffer layer are single crystal aluminum nitride layers.

On the buffer layers, as the first semiconductor layer 10, a Si-doped n-type GaN layer (for example, the Si concentration is $1\times10^{18}$ cm$^{-3}$ to $5\times10^{18}$ cm$^{-3}$ and the thickness is 4 μm), a Si-doped n-type GaN contact layer (for example, the Si concentration is $5\times10^{18}$ cm$^{-3}$ to $1\times10^{20}$ cm$^{-3}$ and the thickness is 0.2 μm), and a Si-doped n-type $Al_{0.10}Ga_{0.90}N$ clad layer (for example, the Si concentration is $1\times10^{18}$ cm$^{-3}$ and the thickness is 0.02 μm) are formed sequentially in this order.

On the first semiconductor layer 10, as the light emitting layer 30, a Si-doped n-type $Al_{0.11}Ga_{0.89}N$ barrier layer and a GaInN well layer are stacked alternately in three cycles and furthermore, a final $Al_{0.11}Ga_{0.89}N$ barrier layer of the multi quantum well is stacked. In the barrier layer, the Si concentration is set to, for example, $1.1\times10^{19}$ cm$^{-3}$ to $1.5\times10^{19}$ cm$^{-3}$. The thickness of the barrier layer is, for example, 0.075 μm. After this, a Si-doped n-type $Al_{0.11}Ga_{0.89}N$ layer (for example, the Si concentration is $0.8\times10^{19}$ cm$^{-3}$ to $1.0\times10^{19}$ cm$^{-3}$ and the thickness is 0.01 μm) is formed. It should be noted that the wavelength of emission light in the light emitting layer 30 is, for example, 370 nm or more and 480 nm or less. Still specifically, the wavelength is, for example, 370 nm or more and 400 nm or less.

Furthermore, as the second semiconductor layer 20, a non-doped $Al_{0.11}Ga_{0.89}N$ spacer layer (for example, the thickness is 0.02 μm), a Mg-doped p-type $Al_{0.28}Ga_{0.72}N$ clad layer (for example, the Mg concentration is $1\times10^{19}$ cm$^{-3}$ and the thickness is 0.02 μm), a Mg-doped p-type GaN contact layer (for example, the Mg concentration is $1\times10^{19}$ cm$^{-3}$ and the thickness is 0.1 μm), and a high concentration Mg-doped p-type GaN contact layer (for example, the Mg concentration is $5\times10^{19}$ cm$^{-3}$ to $9\times10^{19}$ cm$^{-3}$ and the thickness is 0.02 μm) are formed sequentially in this order.

The above-mentioned compositions, composition ratios, kinds of impurities, impurity concentrations, and thicknesses are examples and there can be various modifications.

It should be noted that by setting the Mg concentration of the p-type GaN contact layer to about $1\times10^{20}$ cm$^{-3}$, somewhat higher, it is possible to improve the ohmic characteristics with the second electrode 50. However, in the case of a semiconductor light emitting diode, there is a concern of deterioration in the characteristics by Mg diffusion because the distance between the p-type contact layer and the light emitting layer 30 is short, unlike in the case of a semiconductor laser diode. Herewith, by suppressing the Mg concentration of the p-type contact layer to $1\times10^{19}$ cm$^{-3}$ without considerably degrading the electrical characteristics through the use of the large contact area between the second electrode 50 and the p-type contact layer and the low current density at the time of operation, it is possible to prevent Mg diffusion and to improve emission characteristics.

Furthermore, by using the first metal layer 51 and the second metal layer 52 as the second electrode 50, it is made possible to obtain excellent ohmic characteristics even if the Mg concentration of the p-type contact layer is suppressed to $1\times10^{19}$ cm$^{-3}$.

The first buffer layer functions to relax a difference in crystal type from the substrate 5 and in particular, to reduce screw dislocation.

The surface of the second buffer layer is flattened at the atomic level. Herewith, the crystal defects of the non-doped GaN third buffer layer that grows thereon are reduced. For this purpose, it is preferable for the film thickness of the second buffer layer to be greater than 1 μm. Furthermore, in order to prevent a warp due to distortion, it is preferable for the thickness of the second buffer layer to be 4 μm or less. The material used as the second buffer layer is not limited to AlN and $Al_xGa_{1-x}N$ ($0.8\leq x\leq1$) may be used and by using this, it is possible to compensate for a warp of a wafer.

The third buffer layer grows in a three-dimensional island shape on the second buffer layer, and thus plays a role in the reduction of crystal defects. When the average film thickness of the third buffer layer becomes 2 μm or more, the growth surface of the third buffer layer is flattened. From the viewpoint of reproduction and warp reduction, the thickness of the third buffer layer is appropriately 4 μm to 10 μm.

By adopting these third buffer layers, it is possible to reduce crystal defects to about 1/10 of those of the low-temperature grown AlN buffer layer. By this technique, it is possible to manufacture a highly efficient semiconductor light emitting device despite the high concentration Si-doping to the n-type GaN contact layer (for example, the above-mentioned n-type GaN contact layer) and the emission in the ultraviolet band. By reducing the crystal defects in the buffer layer, it is also possible to prevent light from being absorbed in the buffer layer.

When an amorphous or polycrystalline aluminum nitride layer is provided as a buffer layer in order to relax a difference in crystal type between the substrate 5 made of sapphire and the stacked structure body 10s formed thereon, the buffer layer itself functions as an absorber of light, and thus light extraction efficiency as a light emitting device is reduced. On the contrary to this, by forming the stacked structure body 10s on the substrate 5 made of sapphire via the first buffer layer and the second buffer layer, which are single crystal aluminum nitride layers, it is possible to considerably reduce crystal defects and considerably reduce absorbers in the crystal.

As described above, it is possible for the semiconductor light emitting device 110 to further have the substrate 5 provided on a side opposite to the second semiconductor layer 20 with respect to the light emitting layer 30 (side of a second major surface 10b facing the first major surface 10a) and made of sapphire. Then, it is preferable for the light emitting layer and the second semiconductor layer 20 (the stacked structure body 10s) to be formed on the substrate 5 via a single crystal aluminum nitride layer (for example, the above-mentioned first buffer layer and the second buffer layer). It should be noted that a part of the substrate 5 and the buffer layer may be removed.

Furthermore, it is preferable for the aluminum nitride layer to be provided on the side of the substrate 5 and to have a portion where the concentration of carbon is relatively higher than that on the opposite side of the substrate 5. That is, it is preferable for the first buffer layer to be provided on the side of the substrate 5 and for the second buffer layer to be provided on the opposite side of the substrate 5.

Next, an example of formation of the first electrode 40 and the second electrode 50 in the stacked structure body 10s will be described.

First, a part of the second semiconductor layer 20 and the light emitting layer 30 is removed by, for example, dry etching using a mask, so that the n-type contact layer (for example, the above-mentioned n-type contact layer) is exposed on the surface in a partial region of the first major surface 10a of the stacked structure body 10s.

Next, a patterned lift-off resist is formed on the exposed n-type contact layer and for example, a Ti/Al/Ni/Au stacked film is formed using a vacuum evaporation apparatus, and thus, the first electrode 40 is formed. The thickness of the Ti/Al/Ni/Au stacked film is set to, for example, 300 nm. Then, sinter processing is performed in a nitrogen atmosphere at 650° C.

Next, in order to form the second electrode 50, a patterned lift-off resist is formed on the p-type contact layer (for example, the above-mentioned p-type contact layer). Then, for example, a Ag layer, which forms the first metal layer 51, is formed in a thickness of 180 nm using a vacuum evaporation apparatus and subsequently, a Rh layer, which forms the second metal layer 52, is formed in a thickness of 10 nm. Furthermore, on the second metal layer 52, a Ni layer, which forms the third metal layer 53, is formed in a thickness of 50 nm. Then, after lift-off of the lift-off resist is performed, sinter processing is performed for one minute at 380° C. in an atmosphere of a mixed gas of oxygen and nitrogen in a ratio of 8:2.

If a small amount of moisture or ion compound sticks to the top of the p-type contact layer before the Ag layer is formed, migration and granulation of the Ag layer are promoted and the optimum conditions are lost, and thus the surface of the p-type contact layer is dried sufficiently before the Ag layer, which forms the first metal layer 51, is formed.

Then, for example, a Ti/Pt/Au stacked film is formed in a thickness of 500 nm so as to cover the first electrode 40 and the second electrode 50.

Subsequently, the stacked structure body 10s is cut by cleavage or using a diamond blade etc. into each individual device, and thus, the semiconductor light emitting device 110 is obtained.

As described above, the second electrode 50 is formed by successively forming a Ag layer in a thickness of 180 nm, which forms the first metal layer 51, a Rh layer in a thickness of 10 nm, which forms the second metal layer 52, and a Ni layer in a thickness of 50 nm, which forms the third metal layer 53 on the second semiconductor layer 20 and performing sinter processing for one minute at 380° C. in an atmosphere of a mixed gas of oxygen and nitrogen in a ratio of 8:2.

The second electrode 50 formed as described above has excellent adhesiveness and further, excellent ohmic characteristics, low resistance, and thus excellent electrical characteristics.

Then, the second electrode 50 can be formed at a comparatively low sinter temperature, for example, about 380° C., and thus it is possible to suppress grain growth in the Ag layer of the first metal layer 51. Herewith, the Ag layer exhibits reflection characteristics substantially as excellent as those of the Ag layer before the sinter processing.

As described above, it is possible to obtain the second electrode 50 that satisfies reflectivity, electrical characteristics, and adhesiveness at a high level at the same time and to provide a semiconductor light emitting device that satisfies high luminance, high efficiency, and high reliability at a high level at the same time.

Hereinafter, results of an experiment about changes in various characteristics when the film formation conditions of the second electrode 50 are changed are described.

Figure 2:
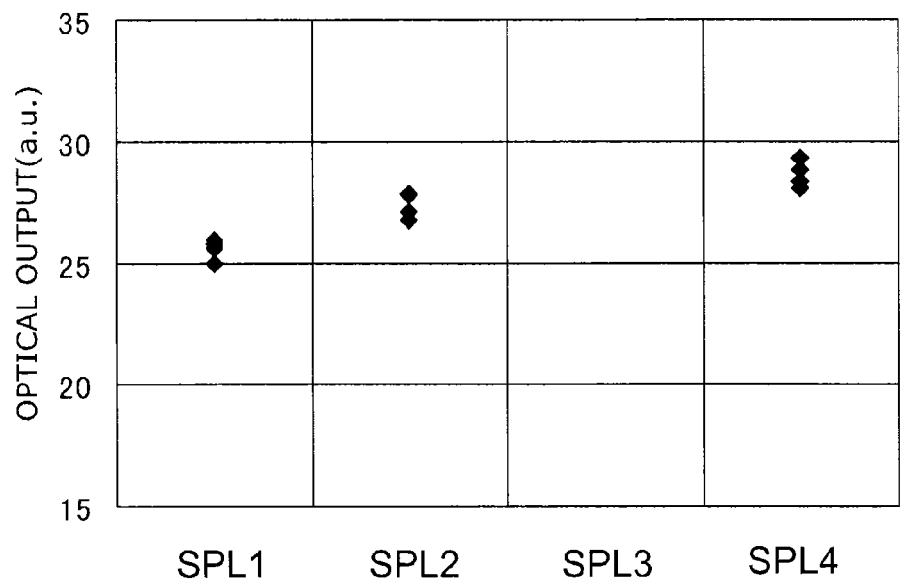
FIG. 2 is a graph showing characteristics of the semiconductor light emitting device.

FIG. 2 is a graph illustrating characteristics of a semiconductor light emitting device.

That is, FIG. 2 shows results of measurement of optical output under each condition when a semiconductor light emitting device is manufactured while changing the film formation conditions of the second electrode 50. The horizontal axis represents the sample number and the vertical axis represents optical output (relative value).

In a first sample SPL1, Ag was formed into a film in a thickness of 180 nm as the first metal layer 51 and Rh was formed into a film in a thickness of 2 nm as the second metal layer 52. The third metal layer 53 was not formed.

In a second sample SPL2, Ag was formed into a film in a thickness of 180 nm as the first metal layer 51 and Rh was formed into a film in a thickness of 10 nm as the second metal layer 52. The third metal layer 53 was not formed.

In a third sample SPL3, Ag was formed into a film in a thickness of 180 nm as the first metal layer 51 and Rh was formed into a film in a thickness of 50 nm as the second metal layer 52. The third metal layer 53 was not formed.

In a fourth sample SPL4, Ag was formed into a film in a thickness of 180 nm as the first metal layer 51, Rh was formed into a film in a thickness of 10 nm as the second metal layer 52, and Ni was formed into a film in a thickness of 50 nm as the third metal layer 53.

In each sample, the second electrode 50 was formed by successively forming the metal layers and performing thermal processing for one minute at 380° C. in an atmosphere of a mixed gas of oxygen and nitrogen in a ratio of 8:2.

For the first to fourth samples SPL1 to SPL4, four semiconductor light emitting devices were manufactured, respectively, and the optical output was measured.

The operating voltage of the semiconductor light emitting device of each of the samples SPL1, SPL2, and SPL4 was substantially the same. However, the optical output of the third sample SPL3 could not be evaluated because the second electrode 50 was peeled off during the period of manufacturing.

As can be seen from FIG. 2, the optical output increases as the film thickness of the metal layers except for the first metal layer 51 becomes greater.

As one of important factors that determine the optical output of such a semiconductor light emitting device as in the embodiment, reflectivity of the second electrode 50 is included. As a metal having high reflection characteristics from near ultraviolet to blue, Ag is included, but it is difficult to obtain sufficient adhesiveness and resistance to environment by Ag and it has been made clear by many experiments that formation of voids between grains because of migration and an increase in grain size cause reduction in reflection characteristics. Formation of a protection film on Ag and sinter processing are performed in order to improve the electrical contact characteristics with the second semiconductor 20 in addition to these characteristics, but depending on processing conditions, the reflection characteristics further deteriorate because of the change in the state of electrons of Ag due to the diffusion of the protection film and migration of Ag. How to suppress deterioration in the reflection characteristics is important.

The second metal layer 52 (Rh) formed on the first metal layer 51 (Ag) diffuses to the boundary surface between Ag and the contact layer, which is p-type GaN, by passing through the grain boundary of Ag etc. and improve contact characteristics, such as adhesiveness, ohmic characteristics, and contact resistance. Furthermore, Rh forms a small amount of solid solution at the boundary surface with Ag, and thus it adheres firmly to Ag and is effective to suppress migration of Ag. Herewith, it is possible to suppress the reduction in reflectivity of the first metal layer 51, which is Ag, and it can be considered that the optical output of the semiconductor light emitting device is improved.

As the film thickness of the second metal layer 52 (Rh) is made greater, the effect of suppressing migration becomes stronger, but the internal stress of Rh itself is large, resulting in the occurrence of peeling of Ag. That is, Ag not subjected to thermal processing is poor in adhesiveness, and thus if Rh is formed too thick, the first metal layer 51, which is Ag, is affected by the internal stress (tensile stress) of Rh and it peels off from the boundary surface with the p-type contact layer. In the experiment, it was recognized that the first metal layer 51, which is Ag, peels off if the film thickness of Rh is increased to 50 nm.

In the fourth sample SPL4, the third metal layer 53 is used, which is Ni the internal stress of which is smaller than that of Rh. Furthermore, the film thickness of the third metal layer 53 is made equal to or greater than the film thickness of the second metal layer 52. Herewith, it is possible to achieve maximization of the optical output by suppressing migration of Ag.

Ni does not form a solid solution with Ag, and thus the effect of suppressing migration by forming the Ni layer directly on Ag is not significant. On the other hand, adhesiveness between Rh and Ni is excellent. Consequently, the film thickness of Rh is formed in that degree thin in which degree the peeling of Ag does not occur by the internal stress of Rh. If Rh is made thin, it is not possible to sufficiently suppress migration of Ag at the time of sinter processing. Herewith, it is possible to effectively suppress migration of Ag as a result by performing sinter processing in a state where Ni the adhesiveness of which with Rh is excellent is formed in a thickness greater than that of Rh.

As described above, by performing sinter processing in the state where the first metal layer 51, the second metal layer 52, and the third metal layer 53 are stacked, it is possible to improve the light extraction efficiency by suppressing migration of Ag, suppressing grain growth of Ag, and maintaining high reflection characteristics of the second electrode 50.

Furthermore, in a semiconductor light emitting device that generates light in a near ultraviolet region of 400 nm or less, the crystal quality of the stacked structure body 10s sensitively affects the characteristics. Herewith, damage to crystal because of migration of Ag cannot be ignored.

That is, Ag used as the first metal layer 51 has properties that migration and chemical reaction, such as oxidation and sulfurization reaction are prone to take place. Furthermore, Ag does not exhibit sufficient adhesiveness unless it is subjected to sinter processing. Even if subjected to sinter processing, there may be a case where sufficient adhesiveness cannot be obtained depending on conditions.

Because of the above, a structure has been tried in which a transparent electrode and an adhesive layer sufficiently thinner than an inverse of the absorption coefficient are sandwiched between the semiconductor layer and Ag in order to improve adhesiveness. However, it has been found that the reflection characteristics are reduced than when Ag is a single layer. In particular, this influence becomes remarkable for emission light having a short wavelength of 400 nm or less.

Moreover, when Ag is subjected to sinter processing at a high temperature of 500° C. or more, the adhesiveness is improved, but the luminance of the semiconductor light emitting device is reduced. The inventors of the invention have found that the reflection characteristics deteriorate as the grain size (average grain diameter) of Ag becomes large from a number of experimental results. That is, it can be considered that the reflection characteristics deteriorate because migration of Ag is promoted by thermal processing and the grain size becomes large.

When a metal layer is formed, after an electrode of Ag is formed, so as to cover the electrode, there is a possibility that Ag causes migration or chemical reaction to deteriorate characteristics on the way of the process. Herewith, there occur restrictions to the conditions on the process of forming a metal layer and processing time. As a result of that, there is a possibility that such a problem that the optimum process cannot necessarily be selected and the characteristics of the semiconductor light emitting device cannot be maximized or a problem of an increase in cost is brought about. It has also been known that when a protection film successively formed after Ag is formed into a film in order to protect the surface of Ag is subjected to sinter processing, a problem of adhesiveness is also brought about by low temperature sinter processing and a problem of reflection characteristics is brought about by high temperature sinter processing.

The inventors of the invention have found conditions that can cause optical output characteristics and electrical characteristics to coexist for an electrode in which the second metal layer 52 and the third metal layer 53 are stacked on the first metal layer 51 including silver or silver alloy having a high reflectivity.

That is, the inventors of the invention have found that the reflection characteristics of Ag deteriorate when the grain size of Ag becomes large form the empirical rules by a number of experiments. The influence of the deterioration of reflection characteristics appears remarkably in particular in a near ultraviolet region of 400 nm or less. In the Ag single layer (only the first metal layer 51 of Ag) as the second electrode 50, the grain size becomes five times or more that before thermal processing even if the thermal processing is performed at 380° C. or less. In contrast to this, it has been known that by covering the surface of the Ag layer (the first metal layer 51), as the second electrode 50, with a metal (the second metal layer 52) including the platinum group metal element, such as Pt, Pd, and Rh, it is possible to maintain substantially the same grain size as that before thermal processing even if the temperature is as comparatively high as 400° C. or more.

For example, when Pt was used as the second metal layer 52, the grain size hardly changed up to 470° C. and at 560° C., it became six times or more that before sinter processing. When the second metal layer 52 was Pd, the tendency was similar and the grain size about two and a half times that before sinter processing up to 380° C. became six times or more after 460° C. It is preferable to adopt conditions under which the grain size does not become large rapidly in order to prevent deterioration of the reflection characteristics because of the increase in the grain size. That is, it is preferable for the grain size of Ag after sinter processing to be about the same as and three times or less the grain size of Ag before sinter processing.

As described above, the deterioration of reflection characteristics of the second electrode 50 due to the increase in the grain size of Ag and migration is one of important factors that determine optical output. As described above, the second metal layer 52 suppresses migration of Ag included in the first metal layer 51, suppresses growth of the grain of Ag, and further protects the Ag layer. Because of these effects, it is made possible to make an attempt to increase luminance, efficiency, and lifetime of the semiconductor light emitting device and at the same time, to maximize characteristics and reduce the cost because there are no longer restrictions to the process.

In the semiconductor light emitting device according to the embodiment, the material used as the substrate 5 is arbitrary and as the substrate 5, the material of, for example, sapphire, SiC, GaN, GaAs, Si, etc., can be used.

The first metal layer 51 includes at least Ag or alloy including Ag.

The reflectivity to the visible light band of a singe layer film of metal other than Ag and Al tends to reduce as the wavelength becomes shorter in the ultraviolet region of 400 nm or less, but Ag has high reflection characteristics also to light in the ultraviolet band of 370 nm or less and 400 nm or less. Because of that, in the semiconductor light emitting device of ultraviolet emission, when the first metal layer 51 is alloy of Ag, it is preferable for the component ratio of Ag in the region on the side of a boundary surface 25 of the first metal layer 51 to be higher. It is preferable for the thickness of the first metal layer 51 to be 100 nm or more in order to secure reflectivity to light.

Ag and Pt form a solid solution and it is considered that migration of Ag can be suppressed by Pt in the vicinity of the boundary surface with Ag mingling with Ag in a region of several nanometers or less in the vicinity of the boundary surface by sinter processing. In particular, Pd and Ag form a perfect solid solution, and thus migration of Ag can be suppressed more effectively by using Pd as the second metal layer 52. By adopting a combination of the first metal layer 51 including Ag and the second metal layer 52 including a platinum group metal element, such as Pt, Pd, and Rh, as the second electrode 50, it is also possible to obtain high reliability at the time of injection of a high electric current.

The second metal layer 52 is required only to be a metal that easily forms a solid solution with Ag and plays a role in suppressing migration of Ag and grain growth. In particular, it is preferable for the second metal layer 52 to be a platinum group metal (for example, Pt, Pd, Rh, Ru, Os, Ir) that improves contact characteristics when diffused slightly at the boundary surface between the first metal layer 51 and the contact layer, which is p-type GaN.

The third metal layer 53 is required only to have an internal stress smaller than that of the second metal layer 52. It is preferable for the work function of the third metal layer 53 to be large so as to allow diffusion of the metal element of the third metal layer 53 at the boundary surface between the first metal layer 51 and the contact layer, which is p-type GaN. For example, the work function of the third metal layer 53 is higher than the work function of Al and Ti.

It is preferable for the diffusion coefficient of the third metal layer 53 to Ag to be smaller than the diffusion coefficient of the second metal layer 52 to Ag. Herewith, the metal element of the third metal layer 53 becomes difficult to diffuse into the first metal layer 51 (Ag).

As a material used as the third metal layer 53, for example, a single layer film or stacked film including high-melting point metals, such as vanadium (V), chromium (Ch), iron (Fe), cobalt (Co), nickel (Ni), niobium (Nb), molybdenum (Mo), ruthenium (Rh), rhodium (Rh), tantalum (Ta), tungsten (W), rhenium (Re), iridium (Ir), and platinum (Pt) is included.

Second Embodiment

Figure 3:
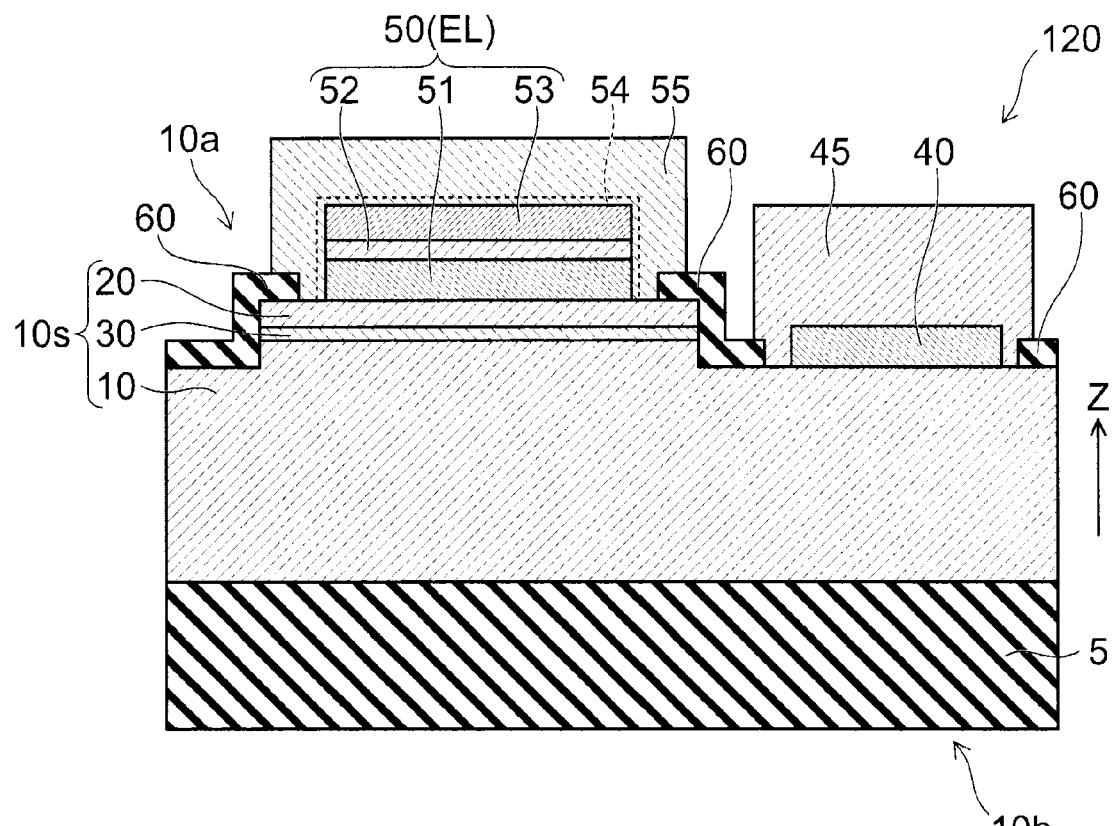
FIG. 3 and FIG. 4 are schematic cross-sectional views showing a semiconductor light emitting device.

FIG. 3 is a schematic cross-sectional view illustrating the configuration of a semiconductor light emitting device according to a second embodiment.

That is, FIG. 3 illustrates the configuration of a semiconductor light emitting device 120, a cross-sectional view corresponding to a cross-section along an A-A' line in FIG. 1B.

As shown in FIG. 3, in the semiconductor light emitting device 120, in the peripheral edge region of the first electrode 40 and the second electrode 50 on the surface on the side of the first major surface 10a of the first semiconductor layer 10 and the second semiconductor layer 20, a dielectric film 60 is formed. Furthermore, on the first electrode 40, a first pad layer 45 is provided. On the second electrode 50, a second pad layer 55 is provided.

The semiconductor light emitting device 120 having such a configuration is manufactured, for example, as follows.

After the stacked structure body 10s is formed as in the semiconductor light emitting device 110, in a partial region of the first major surface 10a of the stacked structure body 10s, a part of the second semiconductor layer 20 and the light emitting layer 30 is removed so that the n-type contact layer (for example, the above-mentioned n-type contact layer) is exposed on the surface.

Next, on the first major surface 10a of the stacked structure body 10s, a SiO$_2$ film, which forms the dielectric film 60, is formed in a thickness of 400 nm using a thermal CVD apparatus.

Next, in order to form the first electrode 40, a patterned lift-off resist is formed on the n-type contact layer and a part of the SiO$_2$ film on the exposed n-type contact layer is removed by ammonium fluoride processing. In the region where the SiO$_2$ film is removed, for example, a Ti/Al/Ni/Au stacked film is formed in a thickness of, for example, 300 nm, using a vacuum evaporation apparatus and after the lift-off, sinter processing is performed at 650° C. in a nitrogen atmosphere.

Next, in order to form the second electrode 50, in the same manner as that of the first electrode 40, a patterned lift-off resist is formed on the p-type contact layer (for example, the above-mentioned p-type GaN contact layer) and the p-type contact layer is exposed by ammonium fluoride processing. At this time, the ammonium fluoride processing time is adjusted so that the p-type contact layer is exposed between the second electrode 50 and the SiO$_2$ film, which forms the dielectric film 60. As a specific example, when the etching rate is 400 nm/min, the total of the time required to remove the SiO$_2$ film in the region where the second electrode 50 is formed and the time of over-etching to expose the p-type contact layer in the proximity of the region by a width of 1 μm is about three minutes.

In the region where the SiO$_2$ film is removed, for example, a Ag layer is formed in a thickness of 180 nm and a Rh layer is formed in a thickness of 10 nm successively after the formation of the Ag layer, and subsequently, a Ni layer is formed in a thickness of 50 nm using a vacuum evaporation apparatus. Then, after the lift-off, sinter processing is performed for one minute at 380° C. in an atmosphere of a mixed gas of oxygen and nitrogen in a ratio of 8:2.

Next, as the first pad layer 45 and the second pad layer 55, for example, a Ti/Pt/Au stacked film is formed in a thickness of 1,000 nm by the lift-off method so as to cover a part of the dielectric film 60 while covering the first electrode 40 and the second electrode 50, respectively. In the specification, the metal (for example, the above-mentioned Ti) of the second pad layer 55 formed on the third metal layer 53 is referred to as a fourth metal layer 54.

By forming the dielectric film 60 in the stacked structure body 10s before forming the second electrode 50 (the first metal layer 51, the second metal layer 52, and the third metal layer 53), which is an ohmic metal, and the first electrode 40 as described above, contaminations that stick to the boundary surface between the electrode and the stacked structure body 10s can be suppressed considerably in the process of forming these electrodes, and thus it is possible to improved reliability, yields, electrical characteristics, and optical characteristics.

By performing oxygen sinter processing of the second electrode 50 after forming the dielectric film 60, it is possible to compensate for oxygen deficiency in the $SiO_2$ film formed by the thermal CVD apparatus.

If a film formed by the sputter method etc. instead of the thermal CVD, which film is excellent in that oxygen deficiency is slight, is adopted as the dielectric film 60, there may be a case where the characteristics of the semiconductor light emitting device deteriorates because of the residual stress of the dielectric film 60. In particular, this phenomenon becomes remarkable when the quality of the crystal of the stacked structure body 10s is poor. Consequently, by the method, in which after forming a thermal CVD film seriously deficient in oxygen and somewhat poorer in quality, then the oxygen deficiency is compensated for, it is more likely to obtain excellent characteristics of the semiconductor light emitting device.

Because the second electrode 50 is covered with the second pad layer 55, the second electrode 50 is separated from the outside air and the second electrode 50 becomes hard to be exposed to moisture and ion impurities, and thus it is possible to suppress migration, oxidation, and sulfurization reaction of the second electrode 50.

Furthermore, since the second pad layer 55 is formed in the region in the proximity of the end part of the second electrode 50 on the side on which the second electrode 50 and the first electrode 40 face each other and an electric current path is formed in the region, the concentration of the current to the second electrode 50 is relaxed. At the same time, since the region of the dielectric film 60 sandwiched by the second semiconductor layer 20 and the second pad layer 55 is formed in the vicinity of the end part of the dielectric film 60 (or a dielectric stacked film) in the region where the second electrode 50 and the first electrode 40 face each other, a weak electric filed is applied between the second semiconductor layer 20 and the second pad layer 55 with the dielectric film 60 (or a dielectric stacked film) sandwiched in between. As a result of that, it is possible to make a structure in which the electric field becomes weaker from the second electrode 50 toward the dielectric film 60 (or a dielectric stacked film), and thus it is possible to relax the concentration of the electric field in this region.

In the manufacturing process of the semiconductor light emitting device 120, it is possible to form the semiconductor light emitting device 120 by the same processes and the same number of processes as conventionally without the need to create a new device.

Herewith, in the semiconductor light emitting device 120, it is possible to realize reduction in leak current, improvement in insulation characteristics, improvement in durability characteristics, improvement in emission intensity, increase in lifetime, high throughput, and low cost.

The great length of the pad (the first pad layer 45 and the second pad layer 55) that covers the dielectric film 60 (or a dielectric stacked film) is advantageous to obtain a structure to relax the electric field via the dielectric film 60 (or a dielectric stacked film), but the risk of the short circuit between the second electrode 50 and the first electrode 40 becomes higher. On the other hand, when the length is small, the risk of the short circuit between the second electrode 50 and the first electrode 40 is reduced.

In the semiconductor light emitting device 120, it is preferable for the diffusion coefficient of the third metal layer 53 to the fourth metal layer 54 to be smaller than the diffusion coefficient of the second metal layer 52 to the fourth metal layer 54. For example, the diffusion coefficient of Ni to Ti is smaller than that of Rh. Herewith, it is possible to cause the third metal layer 53 to function as a barrier metal between the fourth metal layer 54 and the first metal layer 51. That is, it is possible for the third metal layer 53 to suppress Ti (the fourth metal layer 54), which is the first layer of the second pad layer 55, to diffuse to Ag (the first metal layer 51).

Furthermore, it is preferable for the diffusion coefficient of the fourth metal layer 54 to the first metal layer 51 to be smaller than the diffusion coefficient of the second metal layer 52 to the first metal layer 51. Herewith, it is possible to prevent the fourth metal layer 54 from diffusing to the first metal layer 51.

Third Embodiment

Figure 4:
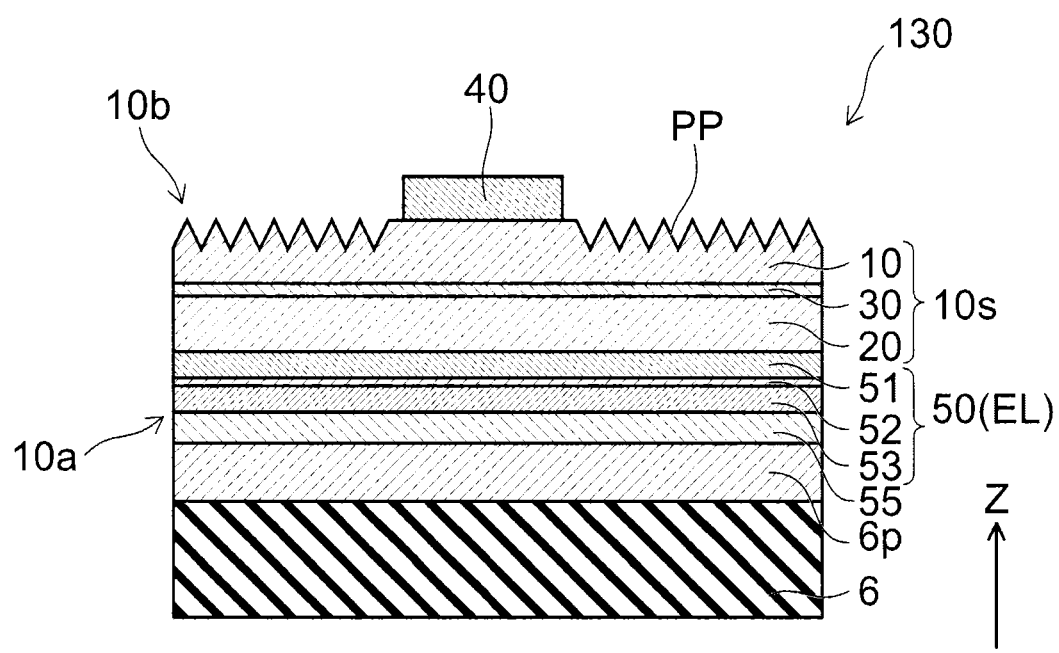

FIG. 4 is a schematic cross-sectional view illustrating the configuration of a semiconductor light emitting device according to a third embodiment.

That is, FIG. 4 is a cross-sectional view when a semiconductor light emitting device 130 is cut in the direction of the stack of the stacked structure body 10s of the semiconductor light emitting device 130.

As shown in FIG. 4, in the semiconductor light emitting device 130 according to the embodiment, the second electrode 50 is provided on the side of the first major surface 10a of the stacked structure body 10s and the first electrode 40 is provided on the side of the second major surface 10b facing the first major surface 10a. Then, in this case, for example, after performing crystal growth of the stacked structure body 10s on the substrate 5 made of sapphire, the substrate 5 is removed.

Then, on the second major surface 10b of the stacked structure body 10s in the region where the first electrode 40 is not provided, irregularities PP are provided. Because of the irregularities PP, it is possible to increase the light extraction efficiency by reflecting emission light from the light emitting layer 30.

The semiconductor light emitting device 130 having such a configuration can be manufactured, for example, as follows.

Figure 5A:
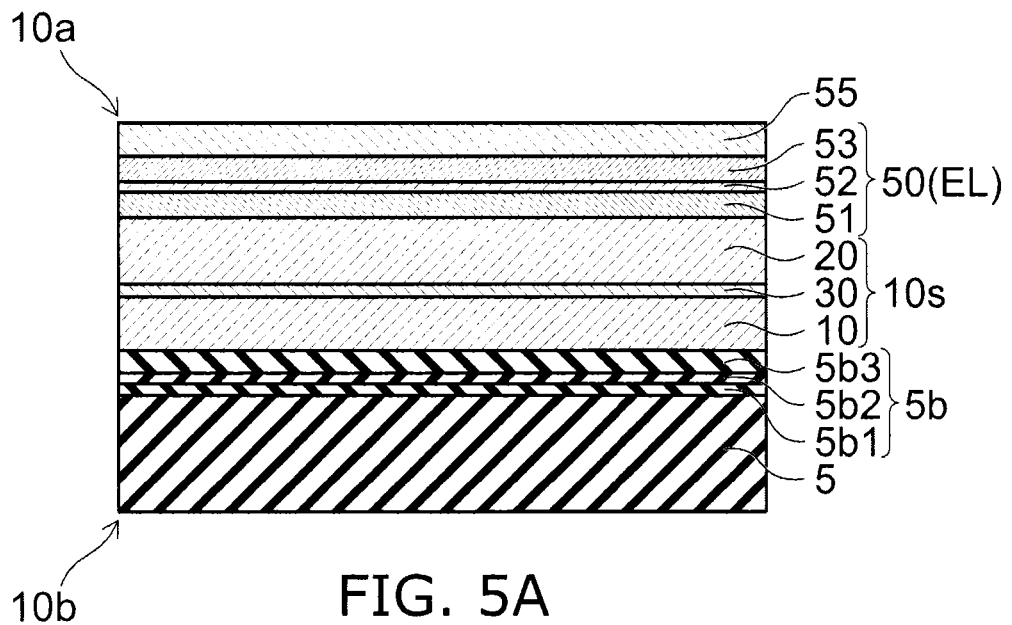
FIGS. 5A and 5B are schematic cross-sectional views showing a method for manufacturing the semiconductor light emitting device.
Figure 5B:
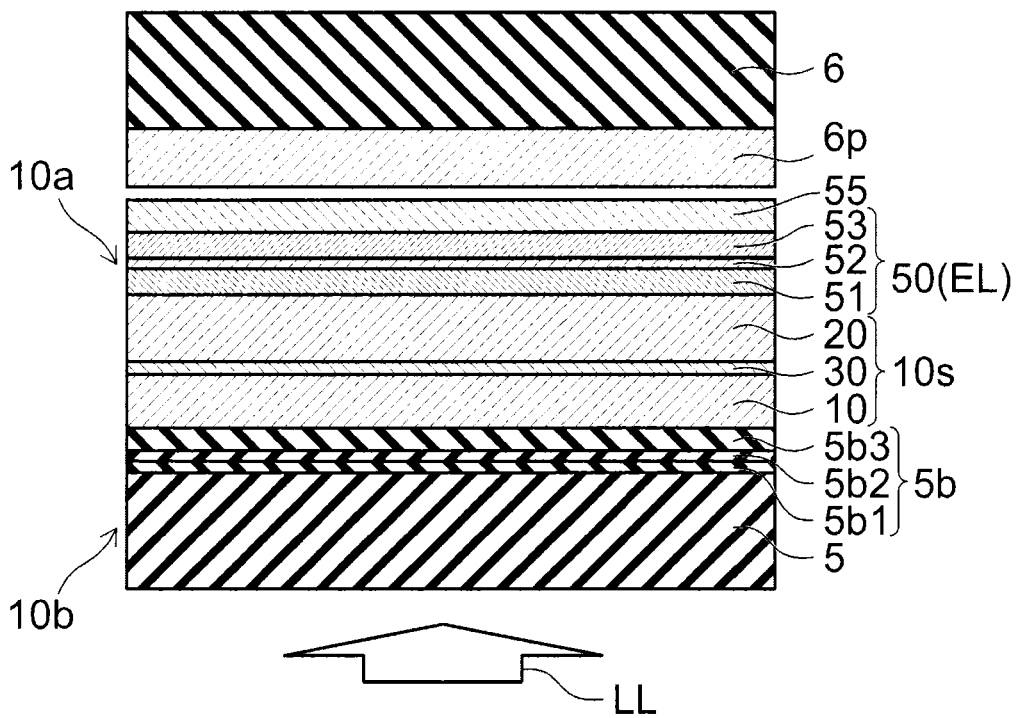

FIGS. 5A and 5B are schematic cross-sectional views illustrating a method for manufacturing the semiconductor light emitting device according to the third embodiment.

First, as shown in FIG. 5A, as in the first and second embodiments, crystal growth of the first semiconductor layer 10, the light emitting layer 30, and the second semiconductor layer 20 is performed on the substrate 5 and thus the stacked structure body 10s is formed.

At this time, as illustrated in FIG. 5A, a buffer layer 5b is provided on the substrate 5 and the stacked structure body 10s is formed thereon. Specifically, as the buffer layer 5b, a first buffer layer 5b1, which is AlN, a second buffer layer 5b2, which is AlN, and a third buffer layer 5b3, which is non-doped GaN, are formed on the substrate 5 made of sapphire.

After this, as in the above, on the p-type contact layer (for example, the above-mentioned p-type GaN contact layer) of the first major surface 10a (on the side of the second semiconductor layer 20) of the stacked structure body 10s, a patterned lift-off resist is formed and a Ag layer (180 nm thick), which forms the first metal layer 51, a Rh layer (10 nm thick), which forms the second metal layer 52, and a Ni layer (50 nm thick), which forms the third metal layer 53, are formed successively and after the lift-off, sinter processing is performed for one minute at 380° C. in an atmosphere of a mixed gas of oxygen and nitrogen in a ratio of 8:2. Herewith, the second electrode 50 is formed.

Then, for example, a Ti/Pt/Au stacked film, which forms the second pad layer 55, is formed in a thickness of, for example, 500 nm so as to cover the second electrode 50.

After that, as shown in FIG. 5B, as an opposite pad layer 6p, a support substrate 6 made of silicon, in which, for example, a Ti/Pt/Au stacked film is provided in a thickness of, for example, 500 nm, and the stacked structure body 10s are arranged facing each other. At this time, the Au layer of the Ti/Pt/Au stacked film of the second pad layer 55 and the Au layer of the Ti/Pt/Au stacked film of the opposite pad layer 6p are arranged so as to oppose each other. Then, the stacked structure body 10s and the support substrate 6 are crimped while being heated and thus the second pad layer 55 and the opposite pad layer 6p are caused to adhere to each other Then, from the side of the substrate 5 made of sapphire, for example, laser light LL of triple harmonics (355 nm) or quadruple harmonics (266 nm) of solid laser of, for example, YVO$_4$ is irradiated. The laser light LL has a wavelength shorter than a forbidden bandwidth wavelength based on the forbidden bandwidth of GaN of the GaN buffer layer (for example, the above-mentioned non-doped GaN buffer layer 5b3). That is, the laser light LL has energy higher than that of the forbidden bandwidth of GaN.

The laser light LL is absorbed efficiently in the region of the GaN buffer layer (the third buffer layer 5b3), which is on the side of the single crystal AlN buffer layer (in this example, the second buffer layer 5b2). Herewith, GaN of the GaN buffer layer, which is on the side of the single crystal AlN buffer layer, is decomposed by heat generation.

Then, by hydrochloric acid processing etc., the decomposed GaN is removed and the substrate 5 made of sapphire is peeled off and separated from the stacked structure body 10s.

Furthermore, the GaN buffer layer (the third buffer layer 5b3) on the side of the second major surface 10b of the second major surface 10b from which the substrate 5 is peeled off is removed by a method, such as polishing, dry etching, and wet etching, and the n-type contact layer (for example, the above-mentioned contact layer, which is n-type GaN) of the first semiconductor layer 10 is exposed.

After this, for example, a Ti/Pt/Au stacked film is formed in a thickness of, for example, 500 nm by the lift-off method etc. on the surface of the n-type contact layer and then the stacked film is patterned to form the first electrode 40. After that, the surface of the n-type contact layer (the first semiconductor layer 10) on which the first electrode 40 is not formed is processed by alkali etching etc. and thus the irregularities PP are formed.

Next, the stacked structure body 10s is cut by cleavage or using a diamond blade etc. and thus the semiconductor light emitting device 130 is manufactured as each individual device.

As described above, in the semiconductor light emitting device 130, the stacked structure body 10s of the semiconductor light emitting device is caused to adhere to the support substrate 6, the substrate 5 on which crystal growth is performed is peeled off, and the peeled-off surface is processed, and then, the first electrode 40 is formed.

In the configuration in which the stacked structure body 10s on the substrate 5 and the support substrate 6 are caused to adhere to each other, the surface on the side of the stacked structure body 10s of the electrode (in particular, the second electrode 50) needs to have high reflection characteristics to emission light and also needs to have sufficiently high adhesiveness. Consequently, by using the structure according to the embodiment of the invention, it is possible to satisfy adhesiveness, reflection characteristics, and electrical characteristics at a high level as the same time, and thus it is possible to realize a semiconductor light emitting device with high luminance and high reliability.

When the stacked structure body 10s on the substrate 5 and the support substrate 6 are caused to adhere to each other and when the GaN layer is decomposed by laser light and the substrate 5 is peeled off, crystal defects 29 are prone to occur excessively in the crystal of the stacked structure body 10s. The crystal defects 29 are thought to be caused by a difference in the thermal expansion coefficient between the support substrate 6, sapphire, and GaN, concentration of heat because of local heating, products generated accompanying the decomposition of GaN, etc.

If the crystal defects 29 and damage occur excessively as described above after sinter processing when forming the second electrode 50, Ag included in the first metal layer 51 of the second electrode 50 diffuses excessively toward the stacked structure body 10s therefrom, resulting in an accelerative, remarkable increase in leak and crystal defects inside the crystal.

According to the above-mentioned specific example, it is possible to form a semiconductor layer of high quality by using the single crystal AlN buffer layer (in this example, the first buffer layer 5b1 and the second buffer layer 5b2) as the buffer layer 5b, and thus damage to the crystal is reduced considerably. Furthermore, when the GaN layer is decomposed by laser light, the single crystal AlN buffer layer having high thermal conduction characteristics is arranged in the proximity of GaN, and thus heat is prone to diffuse and thermal damage by local heating can be suppressed.

As a method for causing the stacked structure body 10s on the substrate 5 and the support substrate 6 to adhere to each other, solder such as AuSn can be used. In general, solder is formed into a film in thickness of several micrometers and the thicker, the larger the distortion applied to the reflection electrode (in this example, the second electrode 50). At this time also, excellent characteristics are obtained even when solder is used by adopting the configuration of the embodiment in which the adhesiveness of the reflection electrodes is high.

Fourth Embodiment

Figure 6:
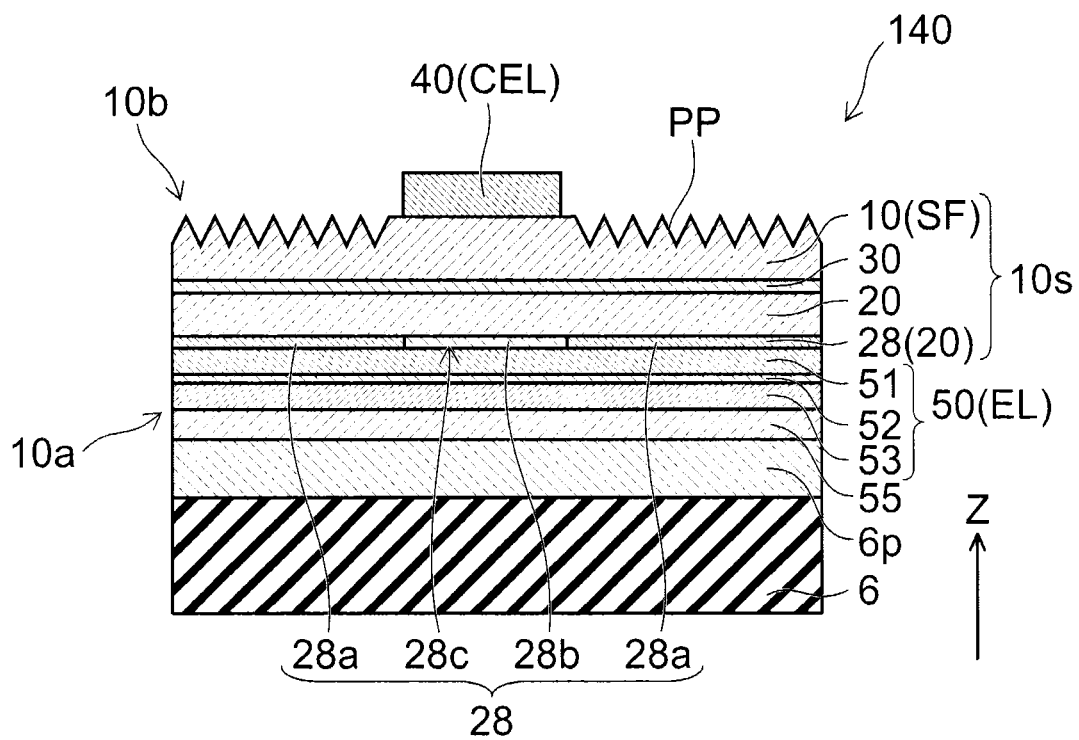
FIG. 6 is a schematic cross-sectional view showing a semiconductor light emitting device.

FIG. 6 is a schematic cross-sectional view illustrating the configuration of a semiconductor light emitting device according to a fourth embodiment.

That is, FIG. 6 is a cross-sectional view when a semiconductor light emitting device 140 is cut in the direction of the stack of the stacked structure body 10s of the semiconductor light emitting device 140.

As shown in FIG. 6, in the semiconductor light emitting device 140, a p-type contact layer 28 (for example, the above-mentioned contact layer, which is p-type GaN) of the second semiconductor layer 20 has a low electrical characteristics part 28c. The low electrical characteristics part 28c is provided selectively on the surface (surface on the side of the first major surface 10a) on the side of the second electrode 50 of a portion 28b facing the first electrode 40, of the p-type contact layer 28.

The low electrical characteristics part 28c is a portion selectively subjected to ashing processing of, for example, the surface on the side of the first major surface 10a of the p-type contact layer 28. A portion 28a not facing the first electrode 40, of the p-type contact layer 28, is not subjected to ashing processing.

The state of the surface of the low electrical characteristics part 28c differs from that of the other portion 28a. Herewith, in the low electrical characteristics part 28c, for example, when ashing processing is performed, a contact resistance Rc increases and ohmic characteristics deteriorate compared with the other portion 28a.

As described above, the semiconductor light emitting device 140 further includes the first electrode 40 (opposite electrode CEL) provided on a side opposite to the light emitting layer 30 with respect to the first semiconductor layer 10 in addition to the stacked structure body 10s and the electrode EL (in this example, the second electrode 50).

Then, the second semiconductor layer 20 (in this case, in particular, the p-type contact layer 28) has the low electrical characteristics part 28c provided in the region (the portion 28b) facing the first electrode 40 (the opposite electrode CEL) on the side of the second electrode 50 (the electrode EL) of the second semiconductor layer 20 and which has at least one of a higher contact resistance between the second semiconductor layer 20 and the second electrode 50 (the electrode EL) and lower ohmic characteristics than those of the region (the portion 28a) not facing the first electrode 40 (the opposite electrode CEL).

The semiconductor light emitting device 140 having such a configuration can be manufactured, for example, as follows.

Before forming the second electrode 50 in the stacked structure body 10s, a resist in the form of a pattern is formed, which exposes the region (the portion 28b) facing the region in which the first electrode 40 is formed, on the first major surface 10a of the second semiconductor layer 20. After that, the surface of the second semiconductor layer 20, which is exposed from the resist, is subjected to, for example, oxygen asher processing. Then, the resist is removed and afterward, by using the technique already described, the semiconductor light emitting device 140 is formed.

Because the low electrical characteristics part 28c has been subjected to the asher processing, for example, the contact resistance Rc increases and it exhibits non-ohmic characteristics, and thus an electric current becomes hard to flow. Herewith, in the light emitting layer 30 in the region facing the first electrode 40, an electric current becomes hard to flow. Herewith, the electric current becomes hard to be injected to the light emitting layer 30 immediately under the first electrode 40, and thus absorption of emission light by the first electrode 40 can be suppressed in the light emitting layer 30 and efficiency is improved.

According to the sinter processing condition described above, it is possible to realize very excellent ohmic characteristics and the low contact resistance Rc, and thus it is possible to realize a configuration in which the electric current does not substantially flow in the low electrical characteristics part 28c by performing a combination of the control of the region where the electric current flows by the low electrical characteristics part 28c to be subjected to, for example, ashing processing and the above-mentioned sinter processing, and this is particularly preferable.

The method for controlling the region where the electric current flows by providing the low electrical characteristics part 28c that is formed by subjecting the surface on the side of the second electrode 50 of the region (the portion 28b) facing the first electrode 40, of the second semiconductor layer 20 (in particular, the p-type contact layer 28), to, for example, ashing processing selectively can be performed independently of the configuration in which sinter processing under a specific condition is performed in a combination of the above-mentioned first metal layer 51 and the second metal layer 52. Herewith, efficiency can be improved.

The method for manufacturing the low electrical characteristics part 28c may be ashing processing or RIE (Reactive Ion Etching) processing. When ICP (Inductively Coupled Plasma)—RIE in a chlorine atmosphere is used, damage to the light emitting layer 30 can be suppressed. The above-mentioned configuration is such one in which the second electrode 50 (the electrode EL) has the first metal layer 51 containing Ag, the second metal layer 52 containing the platinum group metal element, and the third metal layer 53, but such a configuration may be accepted, in which the first electrode 40 (the opposite electrode CEL) has the first metal layer containing Ag, the second metal layer containing the platinum group metal element, and the third metal layer to meet each of the above-mentioned conditions.

Furthermore, it may also be possible for the first electrode 40 and the second electrode 50 to have the above-mentioned configuration, respectively.

Fifth Embodiment

A fifth embodiment is a method for manufacturing a semiconductor light emitting device having the stacked structure body 10s having the first conductivity type first semiconductor layer 10 including a nitride-based semiconductor, the second conductivity type second semiconductor layer 20 including a nitride-based semiconductor, and the light emitting layer 30 provided between the first semiconductor layer 10 second semiconductor layer 20, and the electrode EL (for example, the second electrode 50) provided on a side opposite to the light emitting layer 30 with respect to the second semiconductor layer 20.

Figure 7:
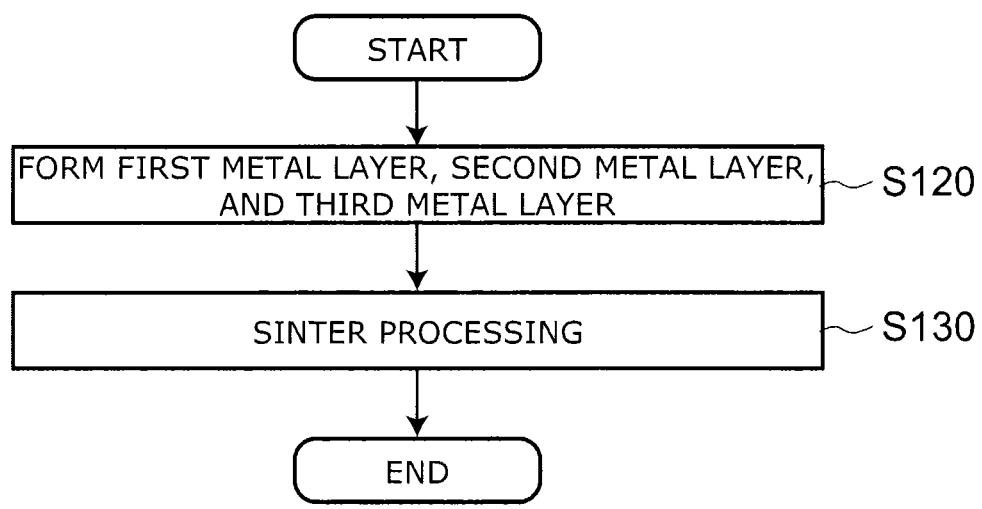
FIG. 7 to FIG. 9 are flowcharts showing a method for manufacturing a semiconductor light emitting device.

FIG. 7 is a flowchart illustrating a method for manufacturing a semiconductor light emitting device according to the fifth embodiment.

As shown in FIG. 7, the method for manufacturing a semiconductor light emitting device according to the embodiment includes a process of forming the first metal layer 51 including silver or silver alloy on the surface (the first major surface 10a) on a side opposite to the light emitting layer 30 with respect to the second semiconductor layer 20, forming the second metal layer 52 including at least one element of gold, platinum, palladium, rhodium, iridium, ruthenium, and osmium on the first metal layer 51, and forming the third metal layer 53 having a thickness greater than the thickness of the second metal layer 52 along the Z axis direction (step S120), and a process of performing sinter processing of the second semiconductor layer 20, the first metal layer 51, and the second metal layer 52 in an atmosphere containing oxygen (step S130).

Then, the temperature of the process of performing sinter processing is temperature at which the average grain diameter (grain size) of silver included in the first metal layer 51 after sinter processing is performed is equal to or more and three times or less the average grain diameter before sinter processing is performed.

For example, when the second metal layer 52 includes Pt, it is preferable for the sinter processing temperature to be less than 560° C. and particularly preferably, 470° C. or less. When the second metal layer 52 includes Pd, it is preferable for the sinter processing temperature to be less than 470° C. and particularly preferably, 380° C. or less. When the second metal layer 52 includes Rh, it is preferable for the sinter processing temperature to be less than 560° C. and particularly preferably, 470° C. or less Herewith, it is possible to reduce the contact resistance Rc of the electrode EL (the second electrode 50) and to improve reflectivity and adhesiveness.

At this time, it is preferable for the oxygen concentration of the atmosphere in sinter processing to be 20% or more. Herewith, it is possible to reduce the contact resistance Rc and to obtain excellent ohmic characteristics.

Then, when the peak wavelength of emission light of the light emitting layer 30 is 370 nm or more and 400 nm or less, it is possible to achieve a particularly high effect. That is, in this range of wavelength, reflectivity is reduced remarkably in metals other than Ag, but the reflectivity of Ag is high and the effect obtained by using Ag in the first metal layer 51 is achieved.

Then, the first metal layer 51 can be a single layer film including silver. Furthermore, it is possible for the second metal layer 52 to include at least one of platinum, palladium, and an alloy including platinum and palladium.

According to the manufacturing method, sinter processing is performed in a state where the first metal layer 51, the second metal layer 52, and the third metal layer 53 are stacked and thus, even when the second metal layer 52 the internal stress of which is large is formed thin, it is also made possible to suppress migration of Ag at the time of sinter processing by the third metal layer 53 formed in a thickness greater than the thickness of the second metal layer 52. Furthermore, the second metal layer 52 the internal stress of which is large can be formed thin, and thus it is possible to suppress peeling of the first metal layer 51 caused by the internal stress of the second metal layer 52 and to provide a semiconductor light emitting device with high production yields.

Figure 8:
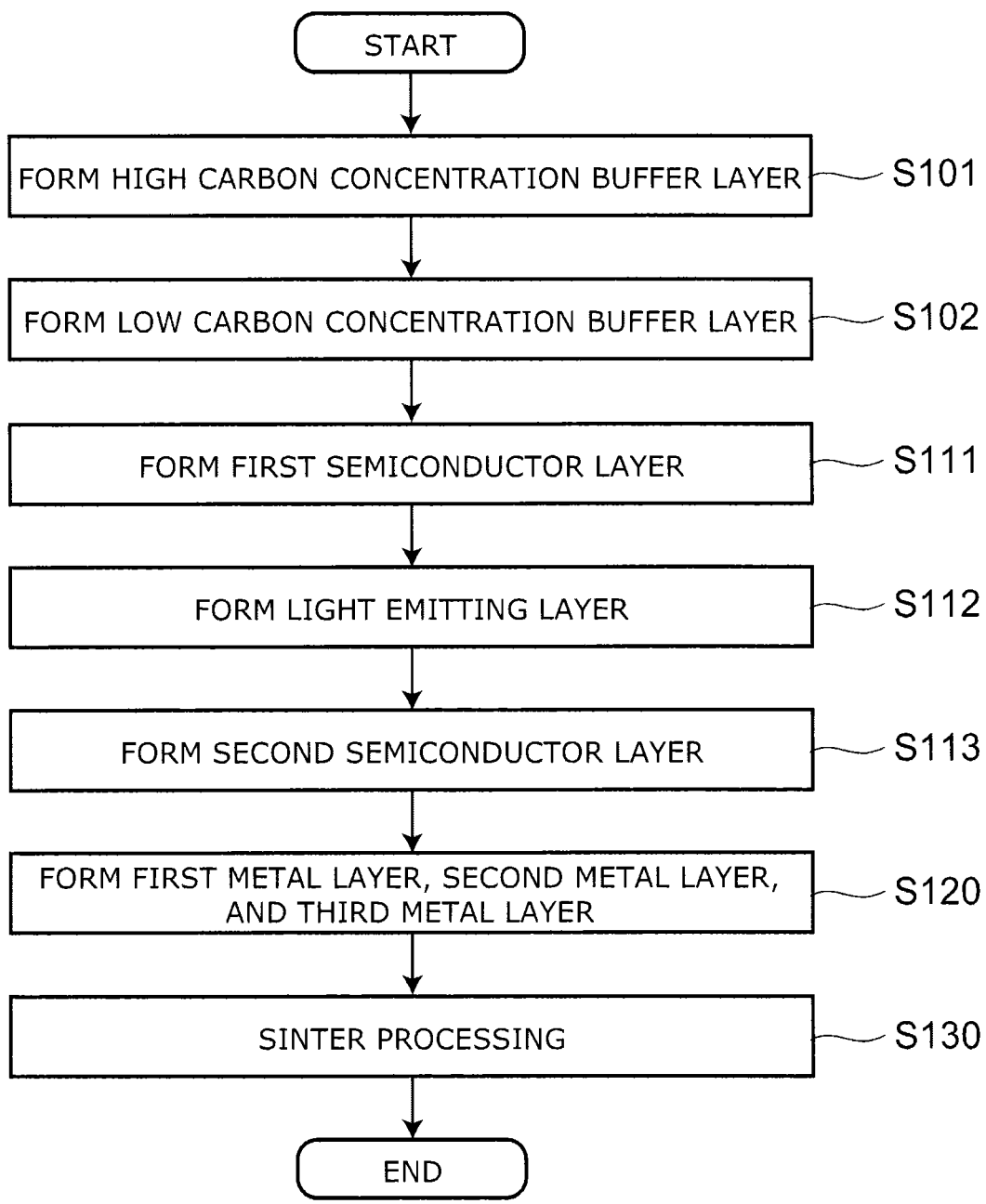

FIG. 8 is a flowchart illustrating another method for manufacturing a semiconductor light emitting device according to the fifth embodiment.

As shown in FIG. 8, the method for manufacturing a semiconductor light emitting device according to the embodiment further includes the following steps.

A step of forming a high carbon concentration part buffer layer (for example, the above-mentioned first buffer layer 5b1) including single crystal $Al_xGa_{1-x}N$ ($0.8 \leq x \leq 1$) and including carbon in a high concentration on the substrate 5 made of sapphire (step S101).

Then, a step of forming a low carbon concentration part buffer layer (for example, the above-mentioned second buffer layer 5b2) including single crystal $Al_yGa_{1-y}N$ ($0.8 \leq y \leq 1$) and the carbon concentration of which is lower than that of the high carbon concentration part buffer layer on the high carbon concentration part buffer layer (step S102).

Then, a step of forming the first semiconductor layer 10 on the low carbon concentration part buffer layer (step S111).

Then, a step of forming the light emitting layer 30 on the first semiconductor layer 10 (step S112).

Then, a step of forming the second semiconductor layer 20 on the light emitting layer 30 (step S113).

By using the buffer layers described above, it is possible to form the first semiconductor layer 10, the light emitting layer 30, and the second semiconductor layer 20 excellent in crystallinity.

As described already, it is preferable for the carbon concentration of the high carbon concentration part buffer layer to be $3 \times 10^{18}$ cm$^{-3}$ or more and $5 \times 10^{20}$ cm$^{-3}$ or less and for the thickness to be 3 nm or more and 20 nm or less.

Figure 9:
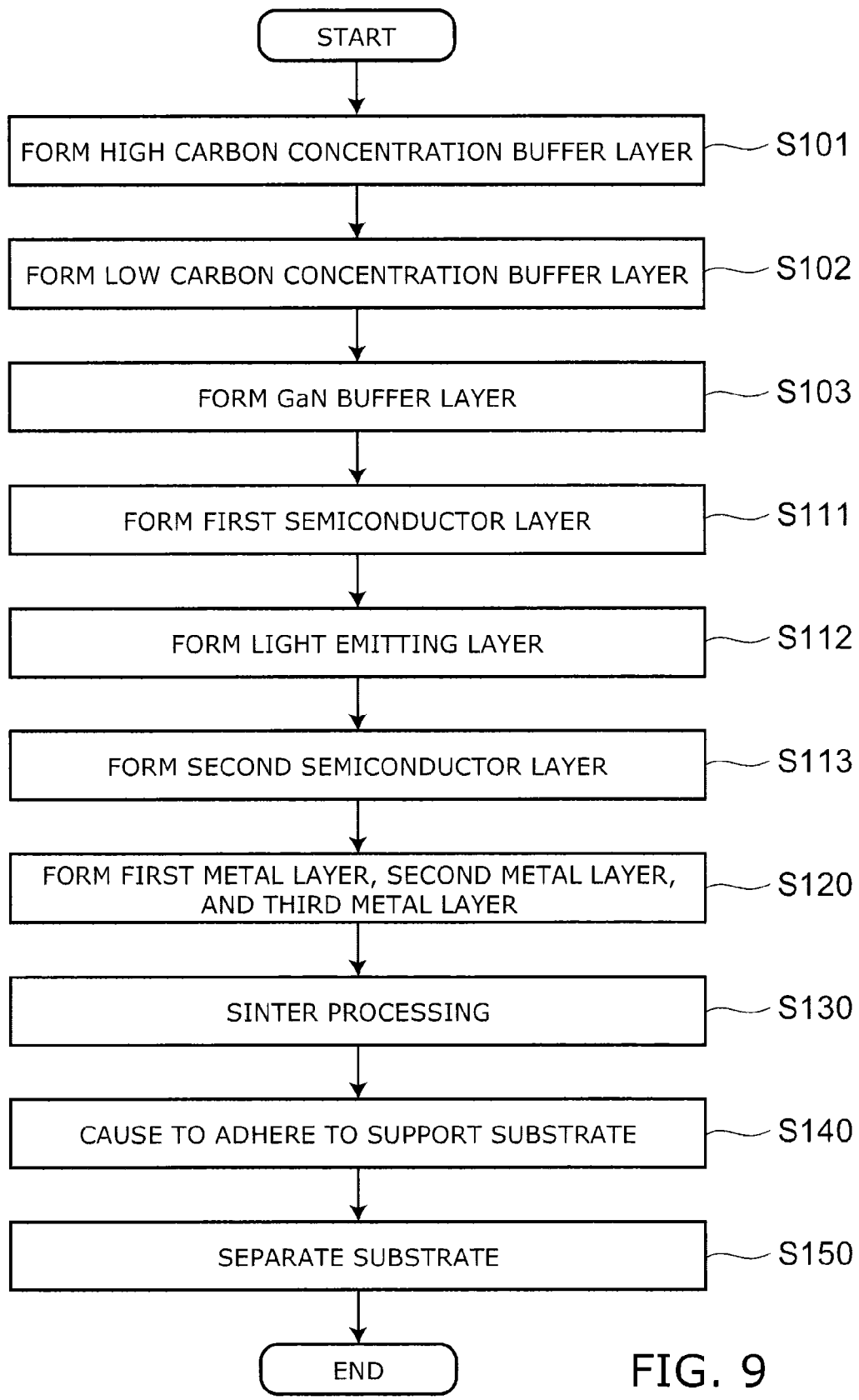

FIG. 9 is a flowchart illustrating another method for manufacturing a semiconductor light emitting device according to the fifth embodiment of the invention.

As shown in FIG. 9, another method for manufacturing a semiconductor light emitting device according to the fifth embodiment further includes the following steps.

A step of forming a GaN buffer layer (the above-mentioned third buffer layer 5b3) including GaN between the low carbon concentration part buffer layer and the first semiconductor layer 10 (step S103).

A step of fixing the electrode EL on the support substrate 6 in a state where the electrode EL (the second electrode 50) is caused to face the support substrate 6 after sinter processing (step S130) (step S140).

Then, a step of separating the substrate 5 from the GaN buffer layer by irradiating the GaN buffer layer with the laser light LL having a wavelength shorter than the forbidden bandwidth wavelength based on the GaN forbidden bandwidth from the side of the substrate 5 to transform at least a part of the portion of the GaN buffer layer, which is on the side of the substrate 5 (step S150).

That is, processing described in relation to FIG. 5B is performed. According to the manufacturing method of the embodiment, the reflection characteristics of the second electrode 50 are high and adhesiveness is excellent, and thus it is possible to manufacture a semiconductor light emitting device of high luminance and high reliability having the configuration in which the support substrate 6 is provided.

Sixth Embodiment

Figure 10:
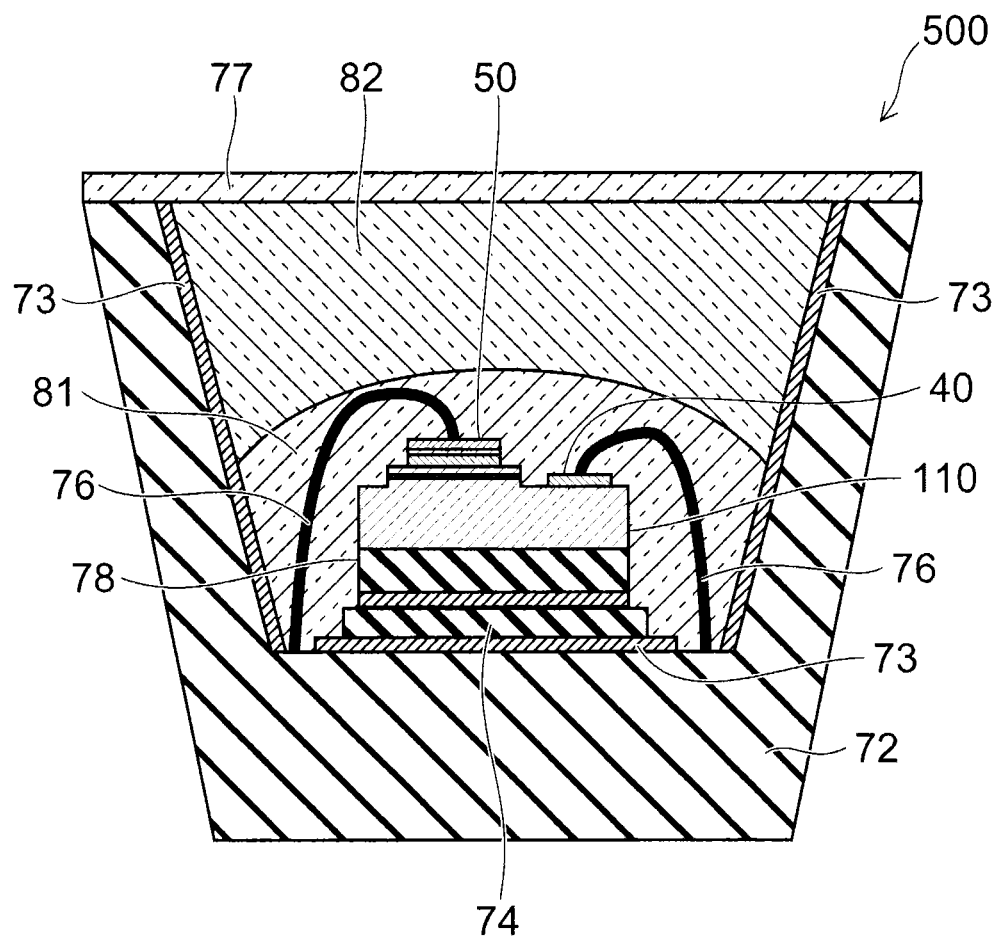
FIG. 10 is a schematic cross-sectional view showing a semiconductor light emitting apparatus.

FIG. 10 is a schematic cross-sectional view illustrating a configuration of a semiconductor light emitting apparatus according to a sixth embodiment.

In the specific example, the semiconductor light emitting device 110 according to the first embodiment is used, but it is possible to use one of the semiconductor light emitting devices according to the above-mentioned embodiments in the semiconductor light emitting apparatus.

A semiconductor light emitting apparatus 500 is a white LED that combines the semiconductor light emitting device 110 and a fluorescent material. That is, the semiconductor light emitting apparatus 500 according to the embodiment includes the semiconductor light emitting device 110 and the fluorescent material that absorbs light emitted from the semiconductor light emitting device 110 and emits light having a wavelength different from that of the above-mentioned light.

As shown in FIG. 10, in the semiconductor light emitting apparatus 500 according to the embodiment, a reflection film 73 is provided on the inner surface of a vessel 72 made of ceramic etc. and the reflection film 73 is provided separately on the inner surface and the bottom surface of the vessel 72. The reflection film 73 is made of, for example, aluminum etc. On the reflection film 73 provided on the bottom part of the vessel 72, the semiconductor light emitting device 110 is installed via a submount 74.

The side of a major surface 15a of the semiconductor light emitting device 110, on which the first electrode is provided, faces upward and the back surface of the conductive substrate 78 is fixed on the submount 74 using, for example, low temperature solder. It is also possible to use an adhesive to fix the semiconductor light emitting device 110, the submount 74, and the reflection film 73.

On the surface of the submount 74 on the side of the semiconductor light emitting device, an electrode on which the conductive substrate 78 of the semiconductor light emitting device 110 is mounted is formed and connected to an electrode, not shown schematically, provided on the side of the vessel 72 by a bonding wire 76. On the other hand, the first electrode 40 is also connected to an electrode, not shown schematically, provided on the side of the vessel 72 by the bonding wire 76. These connections are made at the portion between the reflection film 73 on the inner surface and the reflection film 73 on the bottom surface.

Furthermore, a first fluorescent material layer 81 including a red fluorescent material is provided so as to cover the semiconductor light emitting device 110 and the bonding wire 76 and on the first fluorescent material layer 81, a second fluorescent material layer 82 including a blue, green, or yellow fluorescent material is formed. On the fluorescent material layer, a lid part 77 made of a silicone resin is provided.

The first fluorescent material layer 81 includes a resin and a red fluorescent material dispersed in the resin.

As a red fluorescent material, for example, $Y_2O_3$, $YVO_4$, $Y_2(P, V)O_4$ can be used as a base material and trivalent Eu ($Eu^{3+}$) is included therein as an activator. That is, it is possible to use $Y_2O_3$: $Eu^{3+}$, $YVO_4$: $Eu^{3+}$, etc., as a red fluorescent material. The concentration of $Eu^{3+}$ can be set to 1% to 10% in mol concentration.

As the base material of the red fluorescent material, LaOS, $Y_2(P, V)O_4$, etc., can be used in addition to $Y_2O_3$, $YVO_4$. Furthermore, $Mn^{4+}$ etc. can also be used in addition to $Eu^{3+}$. In particular, by adding a small amount of Bi along with trivalent Eu to the $YVO_4$ base material, the absorption of 380 nm is increased, and thus it is possible to further increase light emission efficiency. Furthermore, as a resin, for example, a silicone resin can be used.

The second fluorescent material layer 82 includes a resin and at least one of blue, green, and yellow fluorescent materials dispersed in the resin. For example, it may also be possible to use a fluorescent material that combines a blue fluorescent material and a green fluorescent material, a fluorescent material that combines a blue fluorescent material and a yellow fluorescent material, and a fluorescent material that combines a blue fluorescent material, a green fluorescent material, and a yellow fluorescent material.

As a blue fluorescent material, for example, $(Sr, Ca)_{10}(PO_4)_6Cl_2$: $Eu^{2+}$ and $BaMg_2Al_{16}O_{27}$: $Eu^{2+}$ can be used.

As a green fluorescent material, for example, $Y_2SiO_5$: $Ce^{3+}$ with trivalent Tb as an emission center, $Tb^{3+}$ can be used. In this case, energy is transferred from Ce ions to Tb ions, and thus the excitation efficiency is improved. As a green fluorescent material, for example, $Sr_4Al_{14}O_{25}$: $Eu^{2+}$ can be used.

As a yellow fluorescent material, for example, $Y_3Al_5$: $Ce^{3+}$ can be used.

As a resin, for example, a silicone resin can be used. In particular, trivalent Tb exhibits sharp emission in the vicinity of 550 nm at which the visual sensitivity is at its maximum, and thus, if combined with sharp red emission of the trivalent Eu, the emission efficiency is improved remarkably.

According to the semiconductor light emitting apparatus 500 according to the embodiment, ultraviolet light having a wavelength of, for example, 380 nm, generated from the semiconductor light emitting device 110 is emitted in the upward and lateral directions of the semiconductor light emitting device 110. Furthermore, by the ultraviolet light reflected from the reflection film 73, the above-mentioned fluorescent material included in each of the fluorescent material layers is excited efficiently. For example, the above-mentioned fluorescent material with the trivalent Eu included in the first fluorescent material layer 81 as an emission center is converted into light having a narrow wavelength distribution in the vicinity of 620 nm. Herewith, it is possible to efficiently obtain red visible light.

By the excitation of the blue, green, and yellow fluorescent materials included in the second fluorescent material layer 82, it is possible to efficiently obtain blue, green, and yellow visible light. Furthermore, it is possible to obtain white light, light in various colors as mixed colors with high efficiency and excellent color rendering properties.

According to the semiconductor light emitting apparatus 500, it is possible to obtain light in a desired color with a high efficiency.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation because of manufacturing processes, etc. It is sufficient to be substantially perpendicular and substantially parallel.

Hereinabove, exemplary embodiments of the invention are described with reference to specific examples. However, the invention is not limited to these specific examples. For example, each of the components, such as the light emitting layer, the nitride-based semiconductor, the first metal layer, the second metal layer, the third metal layer, the first semiconductor layer, the second semiconductor layer, the first electrode, the second electrode, the first pad layer, the second pad layer, the various buffer layers, the substrate, and the dielectric film, the shape, size, material, relationship of arrangement of which are modified in a variety of manners by one skilled in the art, and the manufacturing method, such as a crystal growth process, modified in a variety of manners by one skilled in the art are included in the scope of the invention to the extent that the purport of the invention is included.

Furthermore, any two or more components of the specific examples may be combined within the extent of technical feasibility and are included in the scope of the invention to the extent that the purport of the invention is included.

Moreover, all semiconductor light emitting devices and methods for manufacturing the same practicable by an appropriate design modification by one skilled in the art based on the semiconductor light emitting devices and the methods for manufacturing the same described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, the device including a semiconductor layer including a nitride semiconductor, the semiconductor layer including a light emitting section, the method comprising:

forming a first metal layer on a first surface of the semiconductor layer, the first metal layer including silver or silver alloy, forming a second metal layer on the first metal layer, the second metal layer including at least one element of platinum, palladium, rhodium, iridium, ruthenium and osmium, and forming a third metal layer on the second metal layer, a thickness of the third metal layer along a direction from the first metal layer toward the second metal layer being not less than a thickness of the second metal layer along the direction; and performing sinter processing on the semiconductor layer, the first metal layer, the second metal layer and the third metal layer in an atmosphere including oxygen after the forming the first, second and third metal layers.

2. The method according to claim 1, wherein
the first metal layer includes a plurality of particles including silver,
the first metal layer has a first average diameter of the particles before the sinter processing,
the first metal layer has a second average diameter of the particles after the sinter processing,
the second average diameter is not less than the first average diameter, and
the second average diameter is not more than three times the first average diameter.

3. The method according to claim 1, wherein
a work function of the third metal layer is higher than a work function of aluminum and is higher than a work function of titanium.

4. The method according to claim 1, wherein
a diffusion coefficient of the third metal layer to silver is smaller than a diffusion coefficient of the second metal layer to silver.

5. The method according to claim 1, further comprising forming a fourth metal layer on the third metal layer, and
a diffusion coefficient of the third metal layer to the fourth metal layer being smaller than a diffusion coefficient of the second metal layer to the fourth metal layer.

6. The method according to claim 1, wherein
the first metal layer is a single layer film including silver.

7. The method according to claim 1, wherein
a first region including a boundary between the first metal layer and the second metal layer includes an element included in the second metal layer,
the first metal layer includes a second region apart from the boundary, and
a first concentration of the element in the first region is higher than a second concentration of the element in the second region.

8. The method according to claim 1, wherein
a peak wavelength of light emitted from the light emitting layer is 370 nanometers or more and 400 nanometers or less.

9. The method according to claim 1, wherein
an oxygen concentration in the atmosphere in the sinter processing is 20% or more.

10. A method for manufacturing a semiconductor light emitting device, the device including a semiconductor layer including a nitride semiconductor, the semiconductor layer including a light emitting section, the method comprising:

forming a first metal layer on a first surface of the semiconductor layer, the first metal layer including silver or silver alloy, forming a second metal layer on the first metal layer, the second metal layer including at least one element of platinum, palladium, rhodium, iridium, ruthenium and osmium, and forming a third metal layer on the second metal layer; and performing sinter processing on the semiconductor layer, the first metal layer, the second metal layer and the third metal layer in an atmosphere including oxygen after the forming the first, second and third metal layers, the third metal layer having an internal stress smaller than an internal stress of the second metal layer.

11. The method according to claim 10, wherein
a work function of the third metal layer is higher than a work function of aluminum and is higher than a work function of titanium.

12. The method according to claim 10, wherein
a diffusion coefficient of the third metal layer to silver is smaller than a diffusion coefficient of the second metal layer to silver.

13. The method according to claim 10, further comprising forming a fourth metal layer on the third metal layer, and
a diffusion coefficient of the third metal layer to the fourth metal layer being smaller than a diffusion coefficient of the second metal layer to the fourth metal layer.

14. The method according to claim 10, wherein
the first metal layer is a single layer film including silver.

15. The method according to claim 10, wherein
a first region including a boundary between the first metal layer and the second metal layer includes an element included in the second metal layer,
the first metal layer includes a second region apart from the boundary, and
a first concentration of the element in the first region is higher than a second concentration of the element in the second region.

16. The method according to claim 10, wherein
the first metal layer includes a plurality of particles including silver,
the first metal layer has a first average diameter of the particles before the sinter processing,
the first metal layer has a second average diameter of the particles after the sinter processing,
the second average diameter is not less than the first average diameter, and
the second average diameter is not more than three times the first average diameter.

17. The method according to claim 10, wherein
an oxygen concentration in the atmosphere in the sinter processing is 20% or more.

* * * * *